United States Patent [19]
Tamakoshi

[11] Patent Number: 5,113,235
[45] Date of Patent: May 12, 1992

[54] DYNAMIC RANDOM ACCESS MEMORY

[75] Inventor: Akira Tamakoshi, Tokyo, Japan

[73] Assignee: NEC Corporation, Tokyo, Japan

[21] Appl. No.: 693,121

[22] Filed: Apr. 29, 1991

[30] Foreign Application Priority Data
Apr. 27, 1990 [JP] Japan .................. 2-112403

[51] Int. Cl.⁵ .................. H01L 29/10; H01L 29/78
[52] U.S. Cl. .................. 357/23.4; 357/23.6; 357/46; 357/51
[58] Field of Search .............. 357/23.6 G, 23.6, 23.4, 357/45, 46, 51

[56] References Cited
U.S. PATENT DOCUMENTS

| 4,964,080 | 10/1990 | Tzeng | 357/23.4 |
| 4,969,022 | 4/1990 | Nishimoto et al. | 357/23.6 G |
| 4,999,811 | 3/1991 | Bannerjee | 357/23.6 G |
| 5,016,068 | 5/1991 | Mori | 357/23.4 |

Primary Examiner—Andrew J. James
Assistant Examiner—Sara W. Crane
Attorney, Agent, or Firm—Sughrue, Mion, Zinn, Macpeak & Seas

[57] ABSTRACT

A dynamic random access memory cell comprises a transfer transistor and a trench structure on a semiconductor substrate. The trench structure includes a vertical transistor comprising a buried impurity diffusion layer, an insulation layer and an accumulation node layer. A potential level of the buried impurity diffusion layer is fixed at a high level. The accumulation node layer accumulates charges transferred through the transfer transistor which is at ON state. The vertical transistor becomes ON state when a potential level of the accumulation node layer is high, and becomes OFF state when a potential level of the accumulation node layer is low.

4 Claims, 6 Drawing Sheets

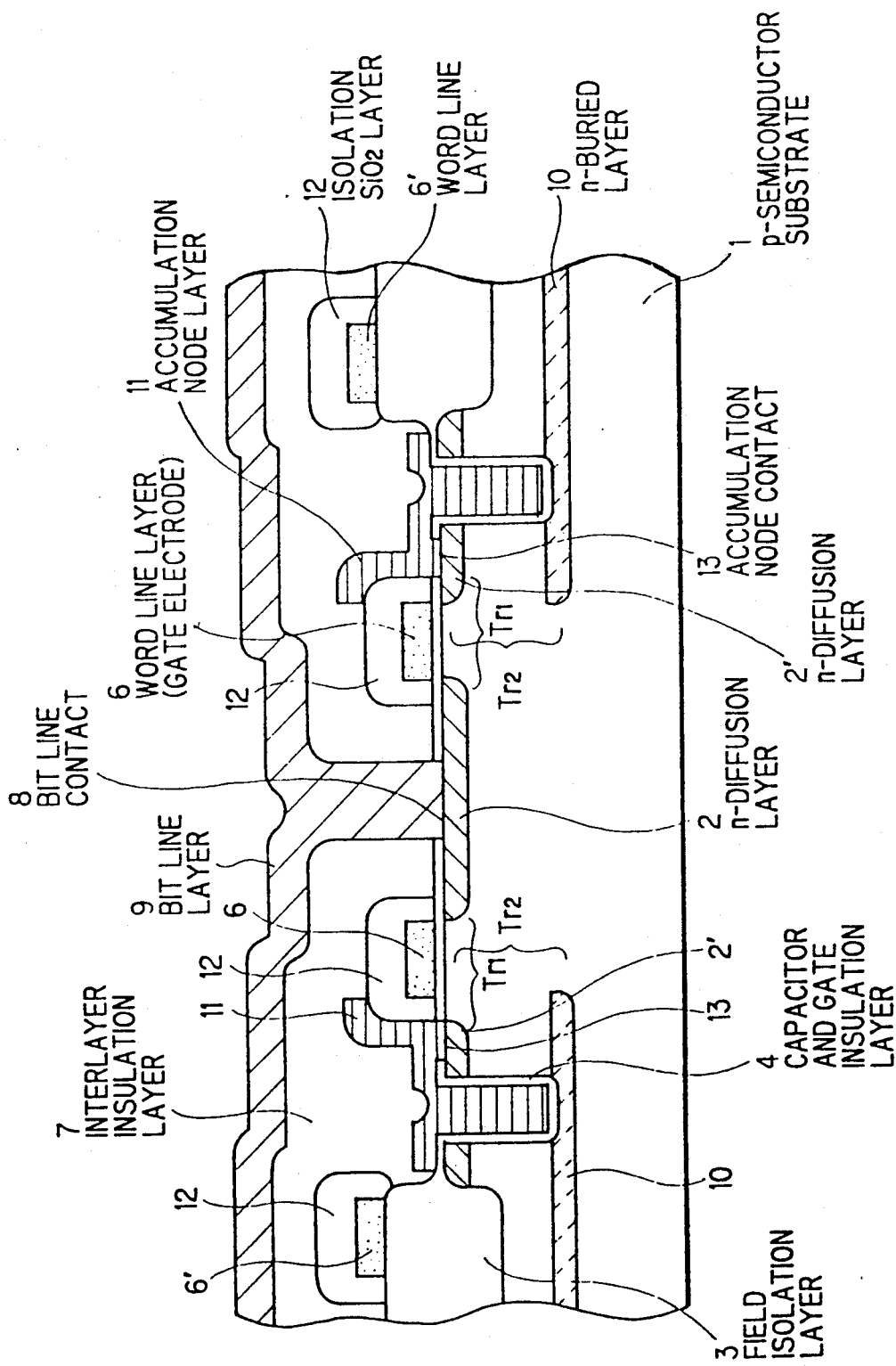

DYNAMIC RANDOM ACCESS MEMORY

FIELD OF THE INVENTION

This invention relates to a dynamic random access memory (D-RAM), and more particularly to, a D-RAM cell having a trench structure.

BACKGROUND OF THE INVENTION

One type of a conventional D-RAM comprises a plurality of memory cells formed on a semiconductor substrate. Each of the memory cells comprises a transfer transistor and a trench-shaped capacitor. A gate of the transfer transistor is connected to a word line of the D-RAM, and a drain thereof is connected to either a bit line or a reference bit line which transfers a reversed signal of the bit line. A source of the transfer transistor and one terminal of the trench-shaped capacitor are formed as one unit. A potential level of the other terminal of the trench-shaped capacitor is fixed at a predetermined level. The bit line and the reversed bit line are connected to a sense amplifier in which a difference of a potential level between the bit line and the reference bit line are amplified. The semiconductor substrate is fixed at a ground level or at a reversed bias level.

In writing operation of data into the memory cell, the word line becomes high (equal to or over $V_{cc}$) to provide an ON state of the transfer transistor, so that a potential level of the bit line, which is either high ($V_{cc}$) or low (GND), is transferred to the trench-shaped capacitor through the transfer transistor. After the writing operation, the word line becomes low to provide an OFF state of the transfer transistor, so that the trench-shaped capacitor is cut off from the bit line to maintain a predetermined potential level.

In reading operation of data from the memory cell, the word line becomes high to provide an ON state of the transfer transistor on condition that the bit line and the reference bit line are at a floating state having a predetermined potential level ($\frac{1}{2} V_{cc}$, for example). If the trench-shaped capacitor retains a high level ($V_{cc}$), the potential level of the bit line increases by $\frac{1}{2} C_s \cdot V_{cc}$ caused by charges stored in the trench-shaped capacitor. If the trench-shaped capacitor retains a low level (GND), the potential level of the bit line decreases by $\frac{1}{2} C_s \cdot V_{cc}$. There is little change in a potential level of the reference bit line during the reading operation, so that the data stored in the memory cell can be read out by detecting the difference of the potential level between the bit line and the reference bit line.

According to the conventional D-RAM, however, there is a disadvantage in that a periodical refreshment of data stored in the trench-shaped capacitor is required to maintain the data, because charges stored in the trench-shaped capacitor is leaked gradually to the semiconductor substrate as the time passes. Furthermore, α-particles generated in a package encapsulating an IC chip including the D-RAM are irradiated to the memory cells, so that charges of memory cells storing high level information leak through junctions to the substrate. This is a disadvantage called a soft error of cell mode.

SUMMARY OF THE INVENTION

Accordingly, it is an object of the invention to provide a D-RAM in which memory contents are retained for a predetermined time to avoid the necessity of a periodical data refreshment.

It is a further object of the invention to provide a D-RAM in which a soft error is prevented.

According to a feature of the invention, a D-RAM comprises:
 a semiconductor substrate of a first conduction type;
 a transfer transistor formed on the semiconductor substrate, the transfer transistor comprising first and second impurity diffusion layers of a second conduction type separately formed on a surface of the semiconductor substrate at a predetermined distance therebetween, a gate insulation layer covering an area between the first and second impurity diffusion layers, and a gate electrode formed on the gate insulation layer;
 a trench structure provided into the semiconductor substrate in which a capacitor insulation layer is formed along a wall of the trench structure;
 a buried impurity diffusion layer of a second conduction type formed below a bottom of the trench structure to touch the capacitor insulation layer and to have a predetermined vertical distance from the second impurity diffusion layer, a potential level of the buried impurity diffusion layer being fixed at a high level;
 an accumulation node layer formed on the trench structure to cover the capacitor insulation layer, the accumulation node layer being connected electrically with the second impurity diffusion layer;
 wherein the second impurity diffusion layer, the buried impurity diffusion layer, the capacitor insulation layer and the accumulation node layer compose a vertical transistor;
 the accumulation node layer accumulates charges transferred from the first impurity diffusion layer through the transfer transistor which is at ON state; and
 the vertical transistor becomes ON state when a potential level of the accumulation node layer is high, and becomes OFF state when a potential level of the accumulation node layer is low.

BRIEF DESCRIPTION OF THE DRAWINGS

The invention will be explained in more detail in conjunction with appended drawings wherein:

FIG. 4 is a cross-sectional view illustrating two memory cells of a D-RAM in a first preferred embodiment according to the invention;

DESCRIPTION OF THE PREFERRED EMBODIMENTS

Before describing a D-RAM cell in preferred embodiments according to the invention, the conventional D-RAM briefly described before will be explained in conjunction with FIGS. 1 to 3.

Figure 1:
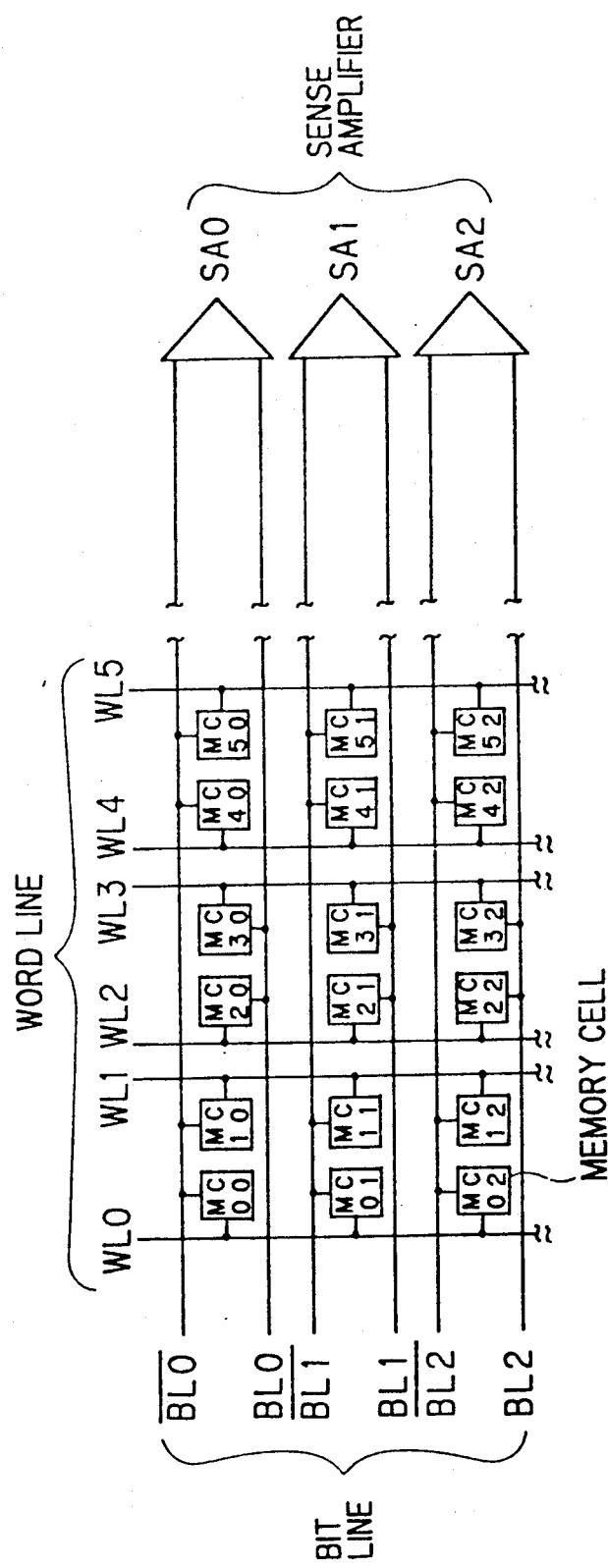
FIG. 1 is a block diagram of a conventional D-RAM.

FIG. 1 is a block diagram of the conventional D-RAM. The conventional D-RAM comprises a plurality of memory cells MCij (i and j=0, 1, 2, ...) disposed in a matrix of a plurality of word lines WLi and a plurality of pairs of bit lines BLj and reference bit lines $\overline{BL}j$ arranged orthogonally to each other. Each pair of the bit lines BLj and the reference bit lines $\overline{BL}j$ are connected to a corresponding one of sense amplifiers SAj.

Figure 2:
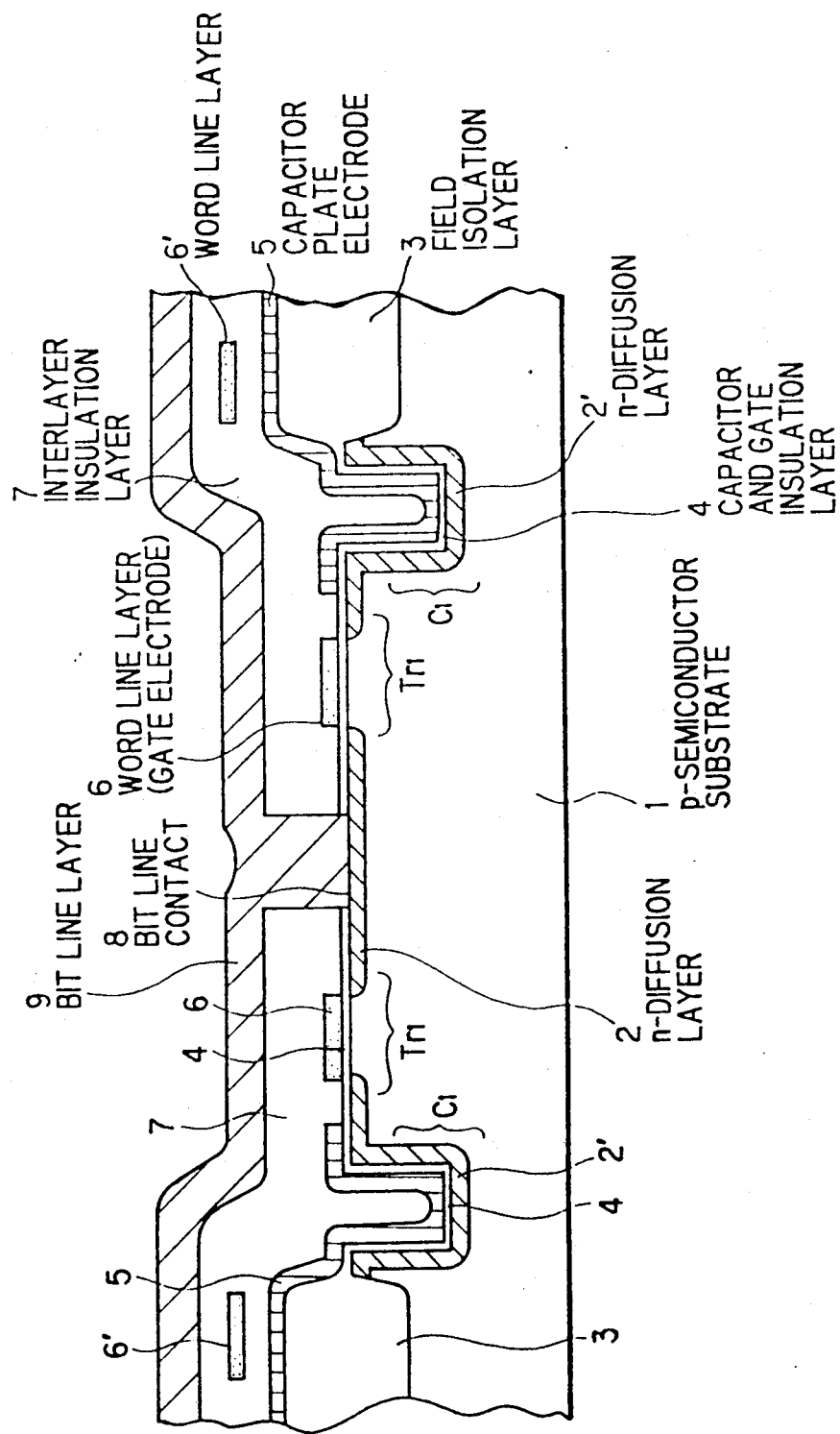
FIG. 2 is a cross-sectional view illustrating two memory cells of the conventional D-RAM.

FIG. 2 is a cross-sectional view illustrating two memory cells of a conventional D-RAM. Each of the memory cells comprises a transfer transistor Tr1 and a trench-shaped capacitor C1. In each memory cell, n-diffusion layers 2 and 2' are locally formed on the p-semiconductor substrate 1. The n-diffusion layer 2 composes a drain of the transfer transistor Tr1. The n-diffusion layer 2' composes a source of the transfer transistor Tr1 and one terminal of the trench-shaped capacitor C1. An insulation layer 4, which is a gate insulator of the transfer transistor Tr1 and an insulator of the trench-shaped capacitor C1, is formed to cover the n-diffusion layers 2 and 2'. The word line layer 6 (word line WLi) which corresponds to a gate electrode of the transfer transistor is formed on the insulation layer 4. A capacitor plate electrode 5 is formed on the insulation layer 4. A field isolation layer 3 is formed continuously with the insulation layer 4 to isolate one memory cell from the other. An interlayer insulation layer 7 is formed on the fabricated surface of the memory cells. A bit line layer 9 (bit line BLj) consisting of a metal layer is formed on the interlayer insulation layer 7 and connected with the n-diffusion layer 2 through a bit line contact 8. The p-semiconductor substrate 1 is fixed at a ground level or at a reversed bias level.

Figure 3:
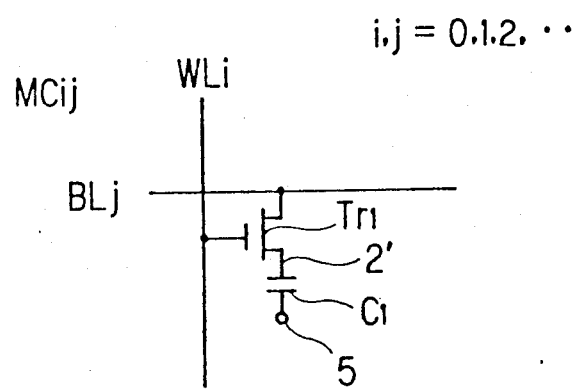
FIG. 3 is an equivalent circuitry diagram of one memory cell of the conventional D-RAM.

FIG. 3 is an equivalent circuitry diagram of one memory cell MCij of the conventional D-RAM. In the memory cell MCij, a gate of the transfer transistor Tr1 is connected to the word line WLi, and a drain thereof is connected to the bit line BLj. A source of the transfer transistor Tr1 is connected to one terminal of the trench-shaped capacitor C1.

Operation of the conventional D-RAM has been described before, so that detailed description thereof will not be made.

Figure 5:
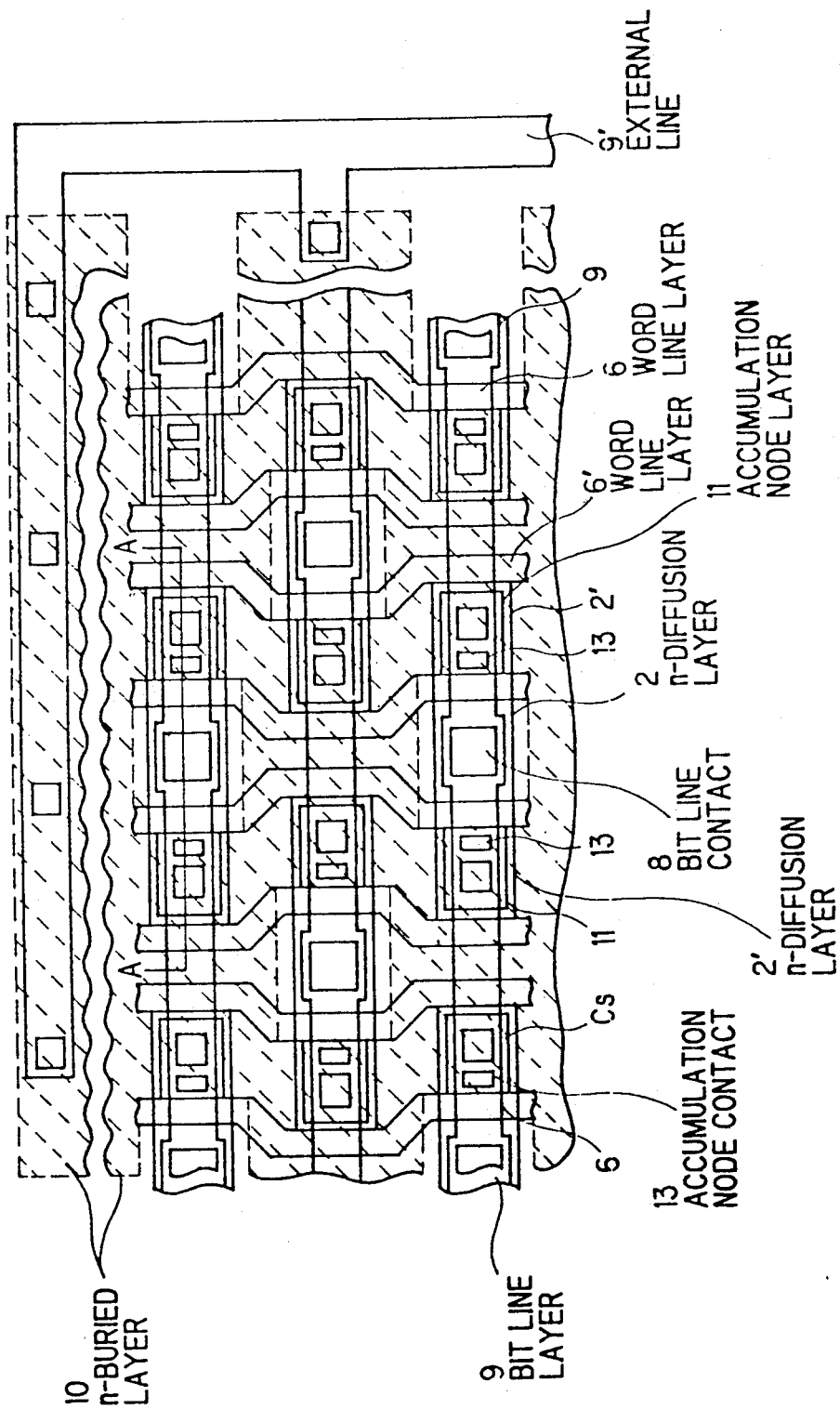
FIG. 5 is a plan view illustrating the D-RAM in the first preferred embodiment according to the invention.

Next, FIG. 4 is a cross-sectional view illustrating two memory cells of a D-RAM in a first preferred embodiment according to the invention, FIG. 5 is a plan view illustrating the D-RAM in the first preferred embodiment according to the invention, wherein like parts are indicated like reference numerals as used in FIG. 2.

In the first preferred embodiment, the basic structure of the D-RAM is the same as that in the conventional D-RAM, however, there are several differences. In the first embodiment, a memory cell of the D-RAM is provided with an n-buried layer 10 which is formed in the semiconductor substrate 1 below a trench structure, wherein the n-buried layer 10 touches an insulation layer 4 directly. The n-buried layer 10 is formed at a predetermined distance from an n-diffusion layer 2', and is avoided to be formed just under the transfer transistor Tr1, so that the bias potential level of the transfer transistor Tr1 should be the same level as that of the p-semiconductor substrate 1. An accumulation node layer 11 is formed on the insulation layer 4 and connected partly with the n-diffusion layer 2' by an accumulation node contact 13. A gate electrode 6 is covered with an isolation $SiO_2$ layer 12 which isolates the gate electrode 6 from the accumulation node layer 11. The isolation $SiO_2$ layer 12 is formed by thermal oxidation of the gate electrode layer 6. In this D-RAM structure, a vertical transistor Tr2 is composed of the n-buried layer 10 as a source, the n-diffusion layer 2' as a drain, and the accumulation node layer 11 as a gate.

A threshold voltage $V_{T2}$ of the vertical transistor Tr2 is set to be approximately 0v or a depletion value, that is $V_{T2}<0$, so as to provide ON state of the vertical transistor Tr2 when a potential level of the accumulation node layer 11 which corresponds to a gate thereof and the n-diffusion layer 2' becomes the same level as that of the n-buried layer 10. A potential level of the n-buried layer 10 is fixed at a level equal to $V_{cc}$ or $|V_{cc}+V_{T2}|$ by using an external line 9'.

Figure 6:
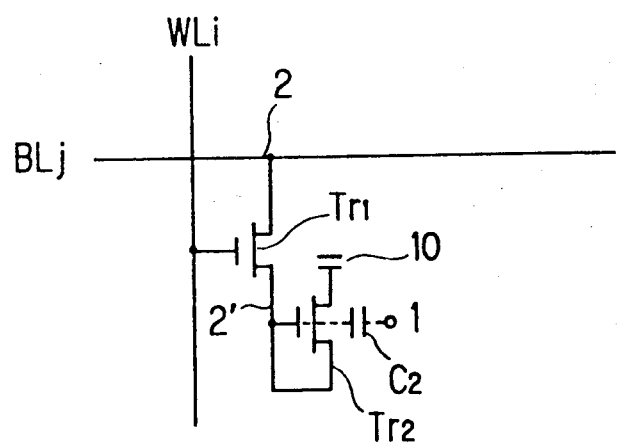
FIG. 6 is an equivalent circuitry diagram of one memory cell of the D-RAM in the first preferred embodiment according to the invention.

FIG. 6 is an equivalent circuitry diagram of one memory cell MCij of the D-RAM in the first preferred embodiment. In the memory cell MCij, a gate of the transfer transistor Tr1 is connected to the word line WLi, and a drain thereof is connected to the bit line BLj. A source of the transfer transistor Tr1 is connected to a gate and a drain of the vertical transistor Tr2. A source of the vertical transistor Tr2 is fixed at a high potential level. A capacitor C2 is formed between a channel of the vertical transistor Tr2 and the p-semiconductor substrate 1.

In writing operation of data into the memory cell, a word line WLi (gate electrode 6) becomes high to provide ON state of the transfer transistor Tr1, so that a potential level of the bit line BLj which is either high or low is transferred to the n-diffusion layer 2' which is connected to the accumulation node layer 11 where charges are stored in accordance with data to be stored in the memory cell.

If the high level is transferred to the accumulation node layer 11 which corresponds to the gate of the vertical transistor Tr2, the vertical transistor Tr2 becomes ON state, so that the potential level of the accumulation node layer 11 is kept high by the n-buried layer 10 which is fixed at a high level through the external line 9'. If the low level is transferred to the accumulation node layer 11, the vertical transistor Tr2 becomes OFF state, so that the potential level of the accumulation node layer 11 is kept low. After the writing operation, the word line WLi remains low to keep the transfer transistor Tr1 at OFF state, so that a potential level of either high or low which is set by the information is kept without changing.

In reading operation of data from the memory cell, a potential level of the bit line BLj and the reference bit line $\overline{BL}j$ is set to be a floating state having the same level ($\frac{1}{2}V_{cc}$, for example). Then, the word line WLi is set to be high to provide ON state of the transfer transistor Tr1 and OFF state of the vertical transistor Tr2. The threshold voltage $V_{T2}$ should be within $-\frac{1}{2}V_{cc}<V_{T2}\leq 0$ to keep the vertical transistor Tr2 at OFF state. If a high level ($V_{cc}$) is kept at the accumulation node layer 11, the potential level of the bit line BLj increases by a level corresponding to charges stored in a capacitor C2 which is formed between the accumulation node layer 11 and the semiconductor substrate 1. If the low level is kept at the accumulation node layer 11, the potential level of the bit line BLj decreases by the level corresponding to the charges stored in the capacitor C2. The difference of the potential level between the bit line BLj and the reference bit line $\overline{BL}j$ is amplified to be read out by the sense amplifier, so that the data stored in the memory cell MCij can be transferred to, for instance, a data processing unit.

In the first preferred embodiment, the data stored in the memory cell is maintained permanently by the n-buried layer 10 which is fixed at a high level through the vertical transistor Tr2, so that the periodical refreshment of data is not required and soft errors occurring in the memory cells may be reduced.

If the rising speed of the word line from low to high is set to be smaller, the time of ON state of the vertical transistor Tr2 becomes long, so that a high potential level margin of the level kept at the accumulation node layer 11 can be obtained. Meanwhile, if a potential level of the n-buried layer 10 is set to be $V_{cc}+|V_{T2}|$, a potential level of the accumulation node layer 11 is kept at up to $V_{cc}+|V_{T2}|$, so that a high level margin can be also obtained.

Figure 7:
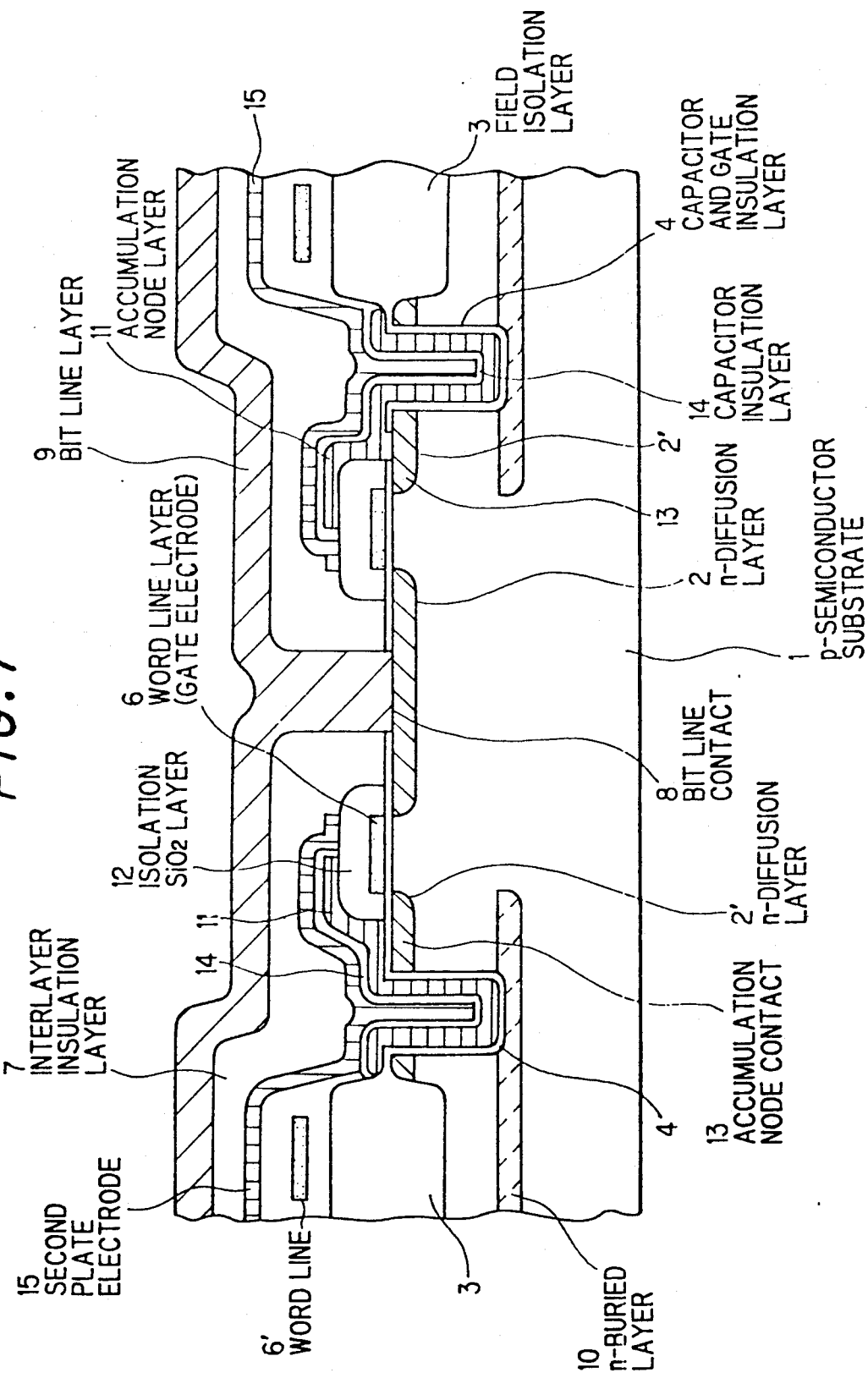
FIG. 7 is a cross-sectional view illustrating two memory cells of a D-RAM in a second preferred embodiment according to the invention.

FIG. 7 is a cross-sectional view illustrating two memory cells of a D-RAM in a second preferred embodiment according to the invention, wherein like parts are indicated like reference numerals as used in FIG. 4. The basic structure of the D-RAM is the same as that in the first preferred embodiment, however, a second plate electrode 15 is additionally formed along with a capacitor insulation layer 14 to form an additional capacitor. A potential level of the second plate electrode 15 is fixed at a predetermined level, which is $\frac{1}{2} V_{cc}$ for example. The second plate electrode 15 is formed by the CVD method.

In this preferred embodiment, the additional capacitor is provided to increase a capacity for accumulating charges, so that there is an additional advantage in that a sense margin in reading data from a memory cell becomes large.

Although the invention has been described with respect to specific embodiment for complete and clear disclosure, the appended claims are not to thus limited and alternative constructions that may occur to one skilled in the art which fairly fall within the basic teaching herein set forth.

What is claimed is:

1. A dynamic random access memory cell, comprising:
   a semiconductor substrate of a first conduction type;
   a transfer transistor formed on said semiconductor substrate, said transfer transistor comprising first and second impurity diffusion layers of a second conduction type separately formed on a surface of said semiconductor substrate with a predetermined distance therebetween, a gate insulation layer covering an area between said first and second impurity diffusion layers, a gate electrode formed on said gate insulation layer;
   a trench structure provided into said semiconductor substrate in which a capacitor insulation layer is formed along a wall of said trench structure;
   a buried impurity diffusion layer of a second conduction type formed below a bottom of said trench structure to touch said capacitor insulation layer and to have a predetermined vertical distance from said second impurity diffusion layer, a potential level of said buried impurity diffusion layer being fixed at a high level;
   an accumulation node layer formed on said trench structure to cover said capacitor insulation layer, said accumulation node layer being connected ohmically with said second impurity diffusion layer;
   wherein said second impurity diffusion layer, said buried impurity diffusion layer, said capacitor insulation layer and said accumulation node layer comprise a vertical transistor;
   said accumulation node layer accumulates charges transferred from said first impurity diffusion layer through said transfer transistor which has been excited to an ON state; and
   said vertical transistor is excited to an ON state when a potential level of said accumulating node layer is high, and an OFF state of said vertical transistor occurs when a potential level of said accumulation node layer is low.

2. A dynamic random access memory cell, according to claim 1, wherein:
   said buried impurity diffusion layer does not extend into a region located just under said transfer transistor.

3. A dynamic random access memory cell, according to claim 1, further comprising:
   an isolation layer which isolates said gate electrode of said transfer transistor from said accumulation node layer.

4. A dynamic random access memory cell, according to claim 1, further comprising:
   a secondary capacitor insulation layer formed on said accumulation node layer; and
   a secondary capacitor electrode formed on said secondary capacitor insulation layer;
   wherein said accumulation node layer, said secondary capacitor insulation layer and said secondary capacitor electrode comprise a secondary capacitor for increasing a potential level of said accumulation node layer.

* * * * *